United States Patent

Kauper et al.

[11] Patent Number: 5,401,370
[45] Date of Patent: Mar. 28, 1995

[54] DEVICE FOR MASKING FIELD LINES IN AN ELECTROPLATING PLANT

[75] Inventors: Rudolf Kauper, Schwanstetten; Gerhard Wilhelm, Feucht, both of Germany

[73] Assignee: Atotech Deutschland GmbH, Berlin, Germany

[21] Appl. No.: 917,022

[22] PCT Filed: Feb. 19, 1991

[86] PCT No.: PCT/DE91/00145
§ 371 Date: Oct. 6, 1992
§ 102(e) Date: Oct. 6, 1992

[87] PCT Pub. No.: WO91/13190
PCT Pub. Date: Sep. 5, 1991

[30] Foreign Application Priority Data

Feb. 20, 1990 [DE] Germany ............ 40 05 209.5

[51] Int. Cl.6 ............ C25D 17/00; C25D 17/06
[52] U.S. Cl. .................. 204/228; 204/242; 204/297 R; 204/297 W; 204/DIG. 7
[58] Field of Search ............ 204/242, 279, 297 R, 204/297 W, 228, DIG. 7; C25D 17/00, 17/06

[56] References Cited

U.S. PATENT DOCUMENTS

| | | | |
|---|---|---|---|
| 2,859,166 | 11/1958 | Grigger | 204/279 |
| 3,090,823 | 5/1963 | Roach | 136/82 |
| 3,821,097 | 6/1974 | Ettel | 204/106 |
| 3,862,891 | 1/1975 | Smith | 204/27 |
| 4,113,586 | 9/1978 | Cook et al. | 204/105 |
| 4,879,007 | 11/1989 | Wong | 204/15 |

FOREIGN PATENT DOCUMENTS

| | | |
|---|---|---|
| 3027751 | 2/1982 | Germany . |
| 3726571 | 3/1989 | Germany . |
| 55-145199 | 12/1980 | Japan . |

Primary Examiner—Kathryn Gorgos
Attorney, Agent, or Firm—Paul and Paul

[57] ABSTRACT

The invention builds on an arrangement for the masking of field lines in an electroplating plant for the treatment of essentially plate-shaped workpieces, which are loaded into the bath suspended from a workpiece holder, wherein a mask is provided which is vertically adjustably guided on the plating tank. To permit the vertical adjustment of the mask regardless of the shape and, in particular, the thickness of the workpiece to be treated, as well as the manner in which the workpiece is held on the workpiece holder, and further, so that said mask(s) can optionally mask the lower or the upper area of the workpiece(s) to be treated, a hold-down clamp (21) is provided, attached to the workpiece holder (6) in such a way as to be height-adjustable and lockable in the particular position, and moves the masks (12, 13; 14, 15) located laterally to the workpieces (5) into a preselected position as the workpiece holder (6) is loaded into the treatment station (1).

17 Claims, 8 Drawing Sheets

DEVICE FOR MASKING FIELD LINES IN AN ELECTROPLATING PLANT

BACKGROUND OF THE INVENTION

The term "essentially plate-shaped workpieces" wherein is intended to signify parts for electroplating which extend primarily within one plane, i.e., are planar in nature, but which can also have parts or sections projecting out of this "plane." A preferred embodiment is printed circuit boards, but the invention is not limited to the treatment of these latter. [German Patent] DE-PS 37 26 571 provides, in a shielding and positioning frame for printed circuit boards in immersion plating plants, a mask, designed like the ridge of a roof and guided by means of lateral tabs into the vertically running slots of a holder. The "ridge" of this "roof" is oriented downward. The mask's initial position is on the surface of the bath. The printed circuit board to be treated is lowered by its bottom edge into the "interior of the roof" and takes the mask downward along with it during the immersion process. This mask prevents "burn-on," i.e., undesirable additional metallization deposits in the lower marginal area of the board. This prior-art device has several disadvantages. The mask must be pressed downward by the printed circuit board. These boards are often very thin and, therefore, unable to transmit the forces necessary for this downward pressing without suffering damage. In such cases, the sensitive printed circuit boards bow outward under the effects of the pressing forces, which can damage the boards and produce differences in the thickness of the deposits on their convex and concave sides. Moreover, the DE-PS 37 26 571 device is limited to masking the lower area of the workpieces to be treated. Thus, it is suitable for treating printed circuit boards of different heights. However, its applicability in this case is limited to only one vertically-positioned printed circuit board at a time, and this board must be suspended by its top edge using means such as retaining clamps.

[Japanese Patent] JP 55-145 199 A, in Patent Abstracts of Japan, Sect. C, Vol. 5 (1981), No. 16 (C-41), sets forth a masking device whose structure corresponds in principle to that of DE-PS 3 726 571; hence, the foregoing commentary applies to it as well.

As for [Japanese Patent] JP 62-116 799 A, in Patent Abstracts of Japan, Sect. C, Vol. 11 (1987), No. 332 (C-455), it sets forth a device that includes a frame interposed between the anode and the piece to be treated, forming a window through which the field lines pass. The height of this window cannot be changed. Only the width of the window can be changed, by means of shielding plates. These plates can be moved inward from the frame's vertical struts according to the degree of shielding desired. As will be seen from the embodiments presented below, the problem and solution dealt with by the present invention cannot be gleaned from this reference document.

DE-OS [German Patent Application, (Unexamined)] 30 27 751 concerns a device for electroplating substrates, primarily by the attachment of the substrate, or of multiple substrates, to an upper contact bar. The level of the contact bar can be adjusted by means of a screw, but this must be performed manually for each level, specifically by loosening the adjustment, placing the contact bar in the proper position and relocking it in said position. Such manipulations are complicated. Also provided are masks for the partial masking of field lines; a disadvantage, however, is that these masks cannot be adapted to the individual workpiece as regards their masking action. Instead, a special mask must be provided for each workpiece shape and size.

SUMMARY OF THE INVENTION

Concerning the present problem, it should be stated that the upper marginal area of the workpiece also requires masking, as a rule, in order to eliminate excessive flux densities, while on the lateral edges this masking function is taken over by either the plating rack or the printed circuit boards mutually. In the latter case, if the printed boards are being held only by the top, an excessive flux density at the extreme left and extreme right edges of the "plating window" is avoided by keeping the total width of the anodes smaller than the total width of the area to be electroplated. The "plating window" is understood to be the area of an item to be electroplated, suspended in a bath, which is effectively utilized, i.e., which is galvanically provided with the metallization. The masking of the upper marginal area of the workpieces is usually effected by means of masks which are fixedly attached either to the workpiece holders or to the anodes. Changing the position of these masks is time-consuming and, thus, is usually not done. As a result, however, the top edge of the workpiece must always be placed in the same position, which, in the case of workpieces of widely varying dimensions, is disadvantageous or, frequently, impossible; for example, if the bottom edge always has to be placed in the same position.

In the case of printed circuit boards mounted on the bars of racks, these bars must be designed for the maximum height of the printed circuit boards. If shorter boards must be treated, these bars press the floating masks downward, and the margin of the board located at a higher level is no longer masked.

The task of the invention, accordingly, is to develop an arrangement, so that the mask can be vertically adjusted regardless of the shape and thickness of the workpiece to be treated, as well as the manner in which the workpiece is held on the workpiece holder (thus permitting the treatment not only of plates, but also of pieces such as those described in the introduction), and wherein said mask(s) can optionally mask the lower or upper area, or both, of the workpiece(s).

The downward-pressing force, necessary in order to shift the masks into the desired vertical position, is produced by a hold-down clamp, so that the workpiece(s) (for purposes of simplification, only "workpiece" will be referred to hereinbelow, although this will include cases in which two or more workpieces are positioned one above the other), are not subjected to the downward-pressing force. An advantage of the present invention, compared to DE-PS 3726571, is that it permits the treatment of multiple workpieces placed vertically one above the other.

The masks acting upon the top edge of the workpiece are designed as floats which, due to their buoyancy, automatically resume their initial position, in which they float on the surface of the bath, after the downward force has been removed and the hold-down clamp has been lifted.

The masks acting upon the bottom edge of the workpiece can also be implemented as floats, or they can be so designed that they sink downward in the plating solution. In the first case, they are pressed downward by appropriately designed hold-down clamps when the workpiece holder is deposited in the treatment station, and, in the latter case, they are pulled to the required level.

Movement of both the top and the bottom masks is guided vertically on the plating tank by their respective ends. Both the upper and the lower areas of the workpiece to be treated can be masked, whereby the hold-down clamp acts upon the masks in either case, thus adjusting them vertically so that their level is adapted to the level of the piece's corresponding edge area.

This arrangement makes it possible (for example, at the loading station during the loading of the plant) for the operator to preselect this adaptation of the mask position by adjusting the hold-down clamp either for the top or the bottom edge of the workpiece. The respective other mask can be permanently adjusted at the treatment station if the relevant edge of the workpiece is always placed in the same position. With the solution according to the invention, however, the level of the permanently adjusted mask can easily be changed, if, for example, necessitated by another type of workpiece.

The invention can be used both in cases where the workpiece to be electroplated (especially electronic printed circuit boards) is suspended from the workpiece holder by means of clamps or the like, and in arrangements in which the workpiece is placed on carrying racks which in turn are attached to the workpiece holder.

BRIEF DESCRIPTION OF THE DRAWINGS

Further details and advantages are explained in the following description and the accompanying drawings of embodiments of the invention, which show:

FIGS. 5 to 5c: on an enlarged scale, the adjustment of the hold-down clamp to the workpiece holder in various views and positions

Figure 1:
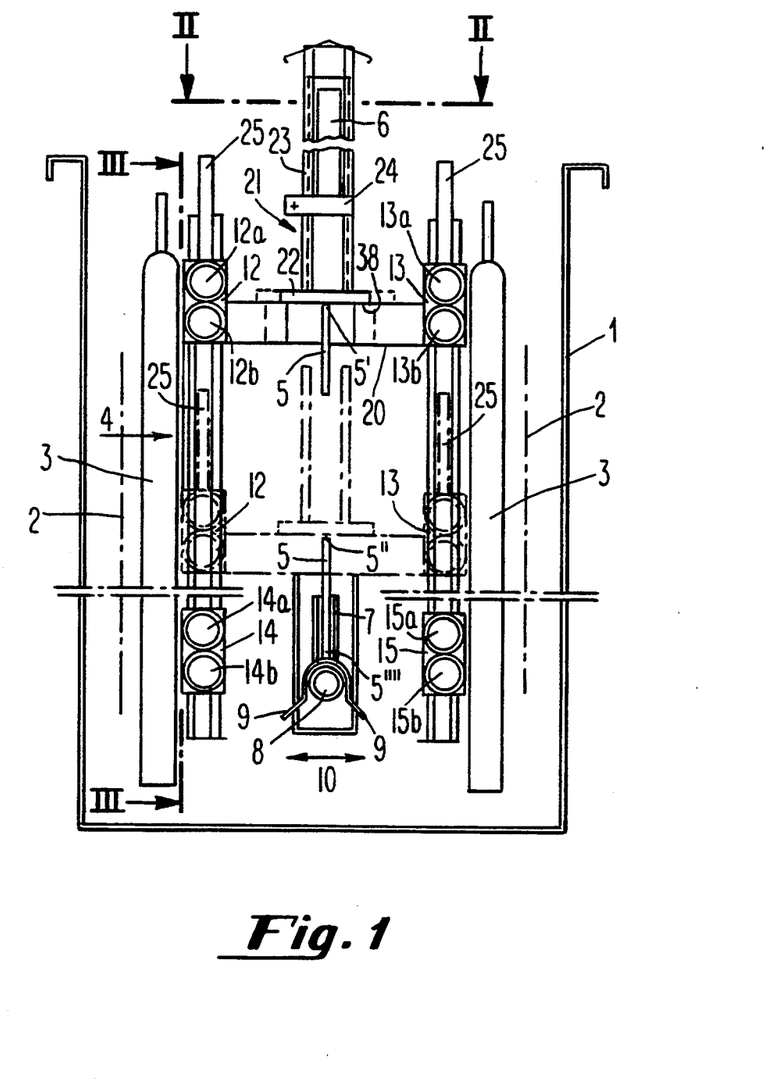
FIG. 1: a cross section of an arrangement according to the invention in a plating bath

Located in the plating tank 1 are the anodes 2, from which the electrical field flows in direction 4, across diaphragm masks 3, to the workpiece to be electroplated, here printed circuit boards 5. A workpiece holder 6 is provided onto which the workpiece 5 is either clamped or, according to the present exemplary embodiment, mounted via carrying racks 7, between and to which the workpiece 5 is attached by means of hold-down clamps or the like 7' (see also FIG. 4). Such carrying devices are known in the art. The workpiece holders with the workpiece suspended therefrom are conveyed over the bath by means such as trucks, which are not shown here since they are also known in the art, and are lowered therein, treated, and then further transported.

The workpiece holder 6 is seated on a tubular carrying rod 8 via the carrying rack 7 with two outwardly projecting pieces of sheet metal 9 in a sort of "riding seat." The carrying rod 8 is moved back and forth in the direction of the double arrow 10, for example by 35 to 40 mm, specifically by means of a tube 11 on which the workpiece holder is deposited, via installations not shown, and which is moved correspondingly back and forth. The articles are hereby moved correspondingly within the bath. The carrying strap 8 is connected via the arms 30 to the tube 11.

Figure 4:
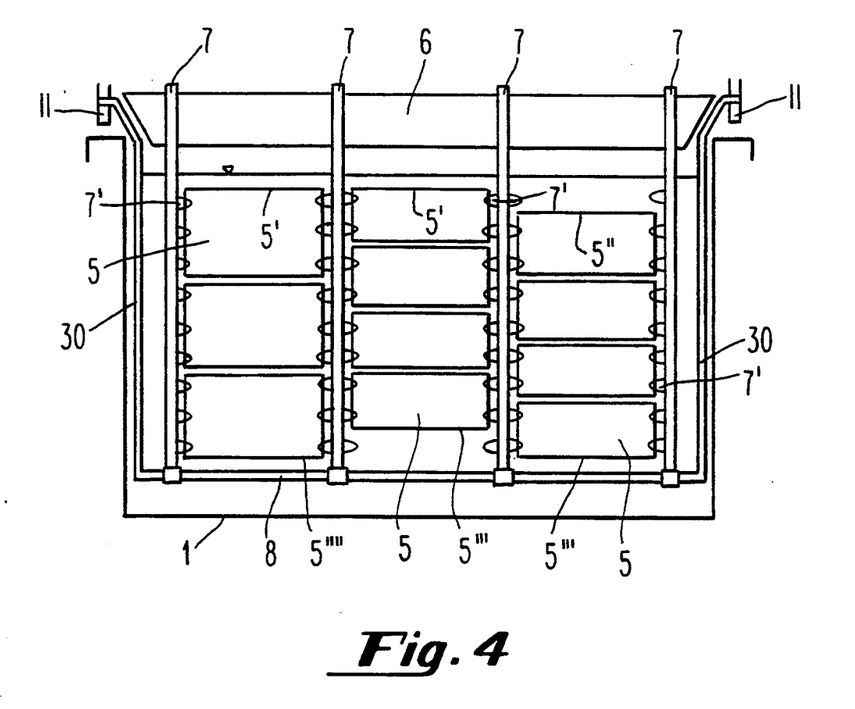
FIG. 4: a schematic view of the bath with the arrangement according to the invention as shown in FIG. 3, wherein the bath is fully illustrated in the corresponding section

FIG. 4, in particular, shows that the levels of the workpiece to be treated within the bath can be different. In the lefthand portion of FIG. 4, for example, the workpiece 5 extends over the entire height of the carrying rack. In the center of FIG. 4, the carrying rack is being loaded with workpieces of smaller height dimensions. The top workpiece edge 5' is at the same level as in the arrangement on the lefthand side, but the bottom edge 5''' is higher than the bottom edge 5'''' in the lefthand portion of FIG. 4.

In the righthand portion of FIG. 4, the carrying rack is being loaded with workpieces of the same type as that shown in the center of the figure, but the arrangement has been so selected that the bottom workpiece edge 5''' is at the same level as edge 5'''' in the lefthand portion of the figure, and the top workpiece edge 5'' is lower than edges 5'.

Whether the top edges or the bottom edges of the workpiece are always to be maintained at the same level depends upon the nature of the carrying rack and how the workpiece is attached thereto (manually or automatically). Naturally, all the top edges and all the bottom edges, respectively, of the workpieces on one workpiece holder must be at the same level.

Figure 3:
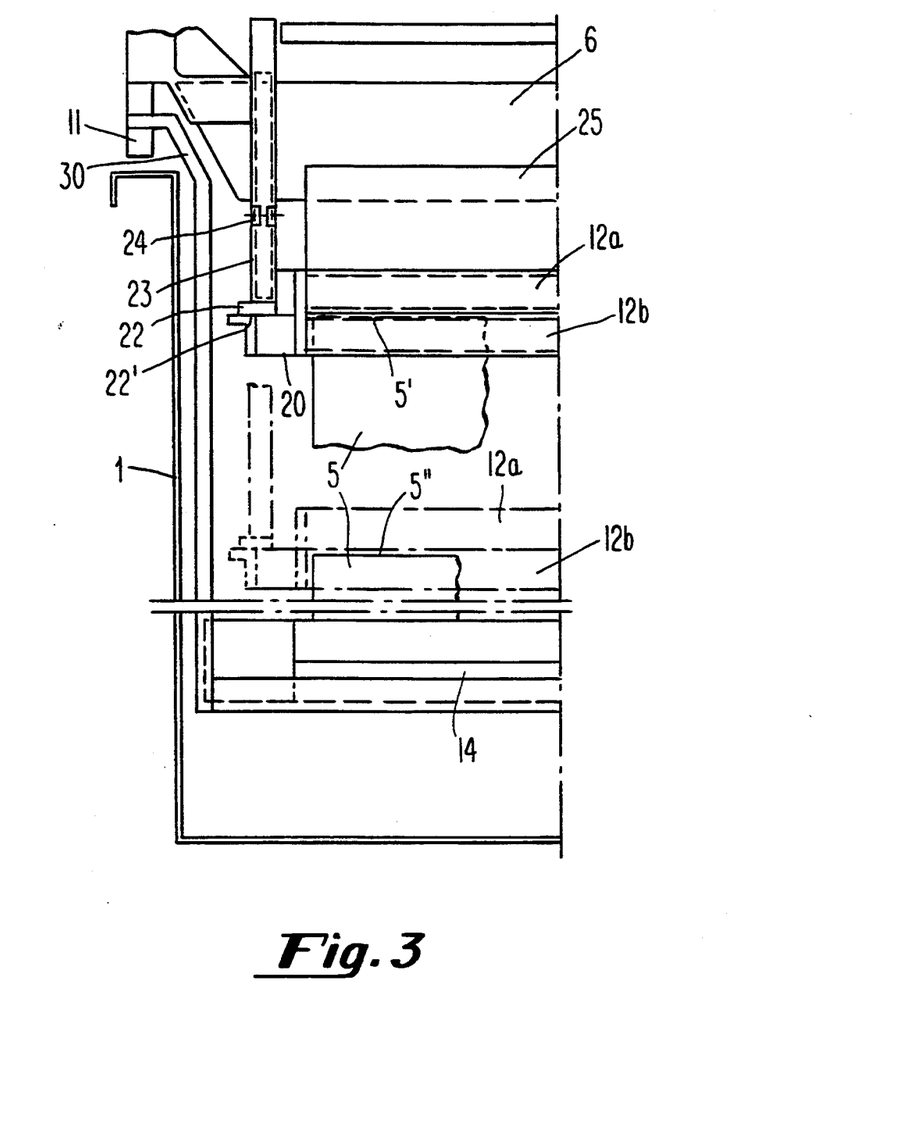
FIG. 3: a partial side view along line III—III of FIG. 1

The respective top and bottom horizontal edges or the areas of the workpieces adjacent to these edges, plus adjacent parts of the rack, must be protected against the undesirable deposition of excessive amounts of metal during the plating process due to a concentration of the field lines 4. This is prevented by means of the masks which will be described in further detail below. FIG. 1 shows two positions of a workpiece 5, the top edge being denoted by reference numeral 5' in the upper position. Another, lower position differentiated from this upper position is also denoted, specifically by a top edge 5'' of workpiece 5. The aforesaid positions are also indicated in FIG. 3.

Figure 2:
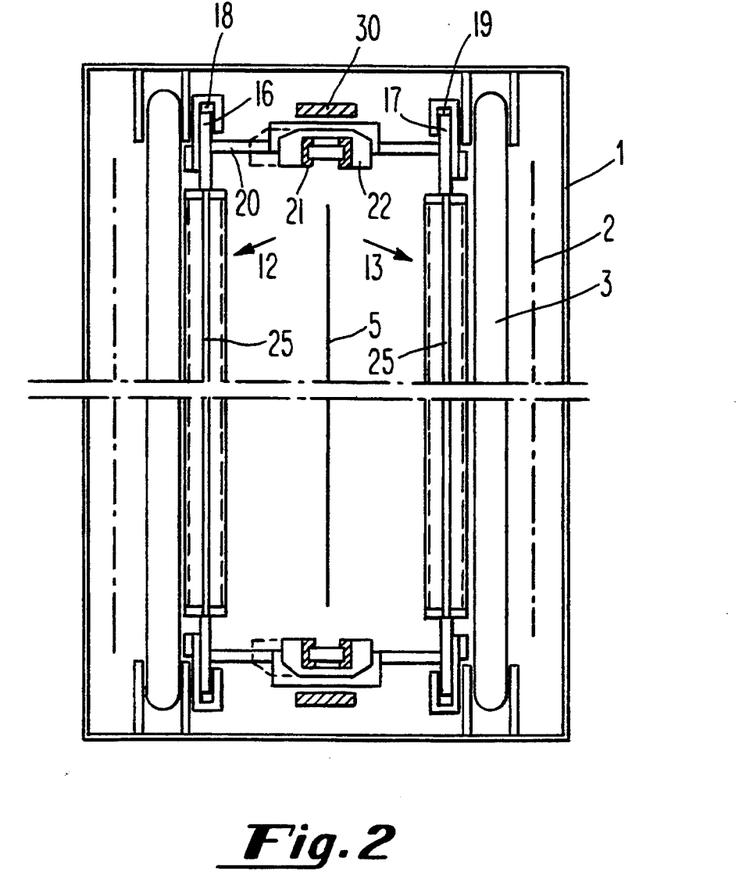
FIG. 2: a section along line II—II of FIG. 1
Figures 5, 5A:
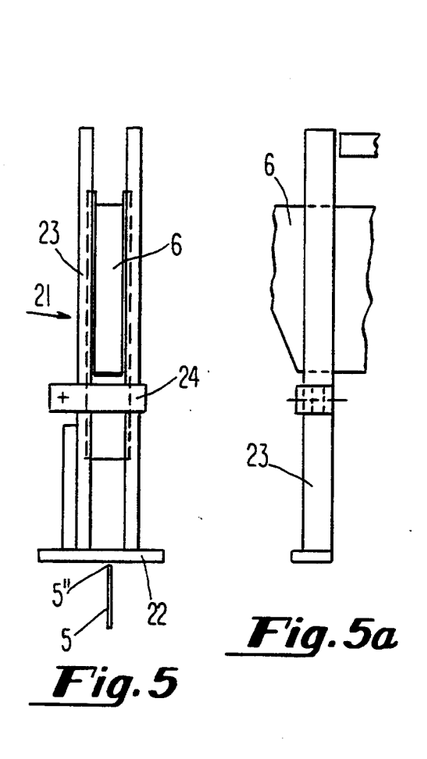
Figure 5B:
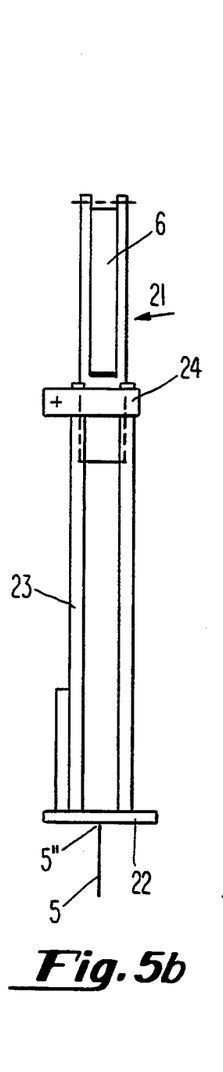
Figure 5C:
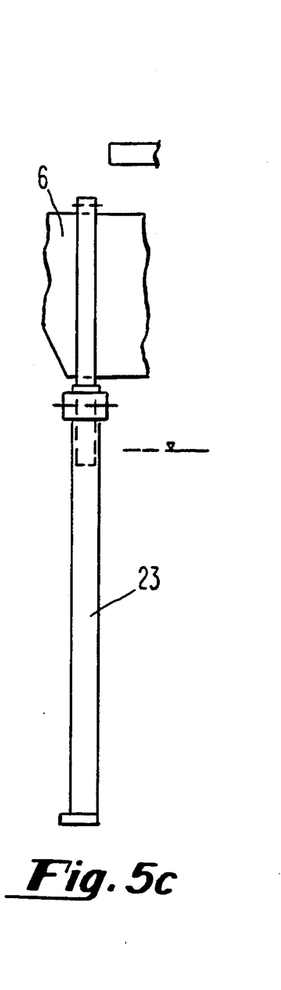

In the example of FIG. 1, in order to mask the upper edges 5' and 5'' of the workpiece, floats are provided on both sides of the items to be treated, i.e., in the illustration according to FIG. 1, to the left and right of the workpiece. Preferably, an upper pair 12, 13 of floats is provided, the pairs each comprising two floats 12a, 12b and 13a, 13b. The floats are lengths of pipe which are closed, e.g., sealed at both ends. The floats belonging together are permanently connected to each other, by welding, for example. They have at their ends guide brackets 16, 17, which are movably conveyed into vertically proceeding slot guiding devices 18, 19 of the plating tanks 1 (see FIG. 2, in particular). The guide brackets 16, 17 on each side are interconnected by a strut-like part or a strut 20. A hold-down clamp 21 with an abutment 22, implemented, for example, as a plate, is able to come to rest on this strut. This hold-down clamp is vertically slid, by means of its shaft, to the workpiece holder, it being possible to lock it at the desired level by means of a clamp strap, or the like, 24. The float or the pair of floats (here the upper pair 12, 13) float on the surface of the bath, not shown, owing to their freely sliding vertical guidance. When the workpiece holder 6 is deposited in the treatment station, the floats are placed and held, by means of the hold-down clamp, at the level at which they can be expected to cause a reduction or partial masking of the field lines acting upon the relevant area of the workpiece to be treated. This is illustrated in FIG. 1 in two different positions. In the upper position, illustrated in unbroken lines, the floats 12, 13 mask the upper edge or region 5' (see FIGS. 5 and 5a), while in the lower position, illustrated in broken lines, the hold-down clamp is positioned lower and, thus, has pressed the pair of floats 12, 13 proportionately far downward, so that they mask the now deeper-lying top edge or region 5" of the workpiece (see also FIGS. 5b and 5c). The depth of the bath has remained the same in both cases. The first-cited variant corresponds to the lefthand and center portions of FIG. 4, and the second-named variant to the righthand portion of FIG. 4. The contact between the abutment 22 of the hold-down clamp 21 and the strut 20 which occurs when the workpiece holder is deposited in the treatment station serves to effect the necessary positioning of the float concerned. The arrangement is advantageously designed so that the bottom edge 38 of the abutment 22 can be adjusted to the same level as the top edge 5' or 5" of the workpiece 5. This enables the operating personnel to make the adjustment easily when loading the plant. However, the operating pressure of the hold-down clamp 21 is transmitted to the float solely via the strut 20 located to the side of the workpiece and spaced therefrom, as illustrated in FIG. 2. As shown in FIG. 1, the respective top edges 5' or 5" of the workpieces are located centrally between the two floats 12a and 12b, etc., of a float and, thus, both the area of the workpiece below the edge concerned and the area of the rack above the edge are correspondingly masked.

Figure 9:
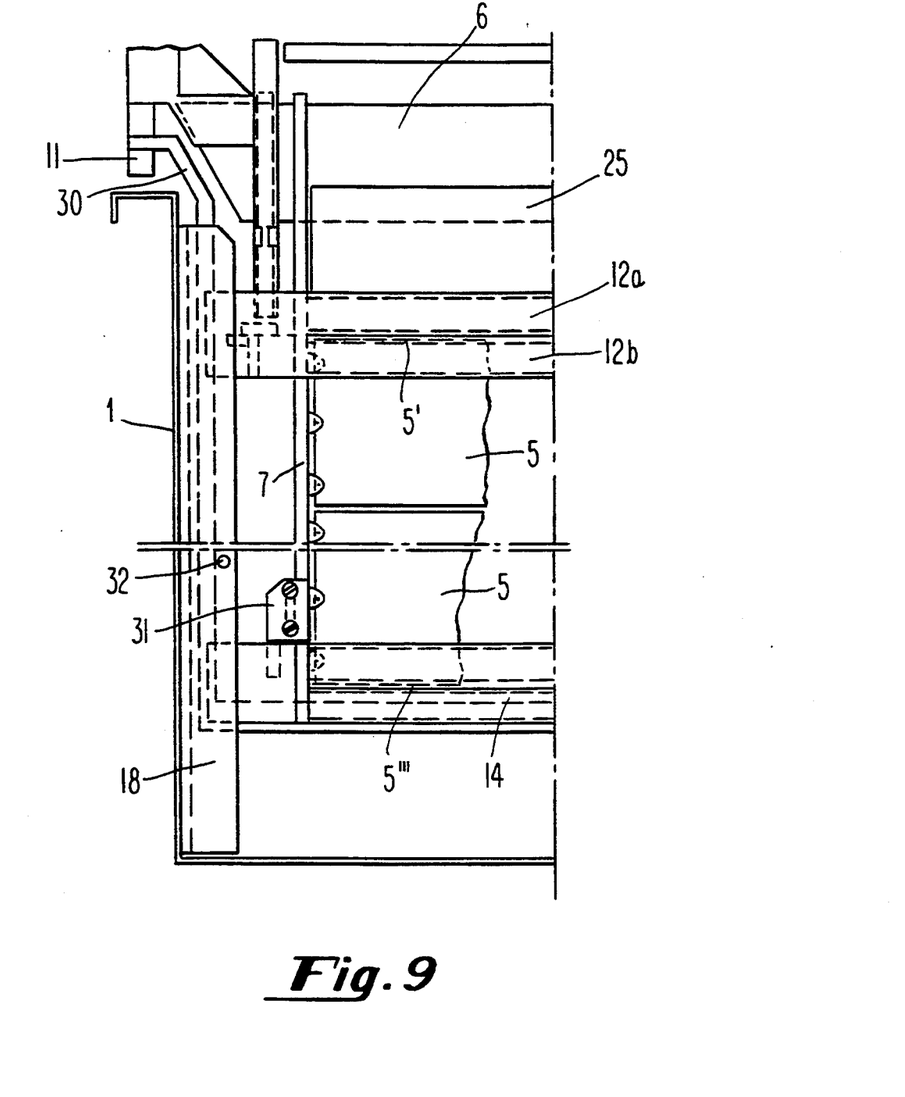
FIG. 9: a partial side view in accordance with FIG. 3, but with another embodiment

In order to ensure the masking of a low-placed area of a workpiece in addition to the upper masking explained above, a pair of masks 14, 15 constructed analogously to the pair of floats 12, 13 is further provided in FIG. 1. This pair of masks can be realized either as floats, or as bodies whose density is greater than that of the treatment fluid. In plants where the bottom edge 5'''''' of the workpiece is always disposed at the same level, the position of the pair of masks 14, 15 is fixed by means of a screw connection (not shown), while the mounting is advantageously extended out over the surface of the bath, so that a level correction can be easily made, even subsequently. However, if the pair of masks 14, 15 is implemented in the form of floats, these floats can also be moved into a desired position by means of a hold-down clamp 31 mounted, for example, on the outer bars of the rack 7, the maximum level being limited by a stop 32 in order to prevent a collision with the upper pair of masks 12, 13 (see FIG. 9).

Figure 10:
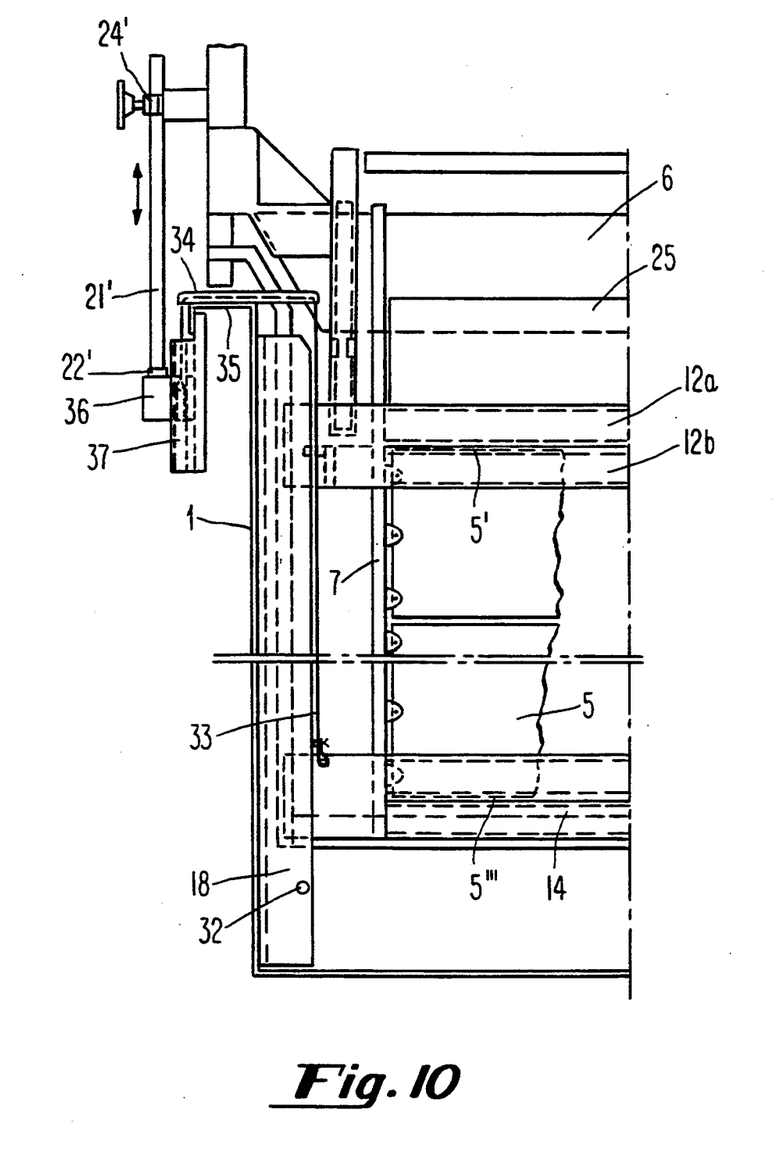
FIG. 10: a partial side view in accordance with FIG. 3

The aforementioned embodiment, in which the lower pair of masks 14, 15 is implemented in the form of bodies whose density is greater than that of the treatment fluid and which are moved into a desired position as the workpiece holder 6 is deposited in the treatment station, is illustrated in FIG. 10. Here the masking body 14—like 15—is suspended from a flexible band 33 which is guided via a guiding arrangement over the rim of the tank 35 to a sliding block 36 and is attached thereto. The sliding block 36 can be moved vertically up and down in a guide part 37.

When the workpiece holder 6 is deposited in the treatment station, a hold-down clamp 21', which is now applied externally to the workpiece holder 6, presses with its abutment 22' on the sliding block 36 and pushes it downward, by which movement the masking body 14 is pulled up over the band 33. The level of the hold-down clamp 21' can be adjusted by means of a clamping device 24', whereby a position can be selected which brings the masking body 14 into the desired position for masking the bottom edge 5''' of the workpiece. In this case, the hold-down clamp does not press directly on the masking body 14, 15, but on the above-mentioned sliding block 36, which action also adjusts the level of the masking body, as explained. Here again, therefore, the hold-down clamp causes the masks to move into the preselected position.

The lowest position of the masking body 14 is limited by the stop 32 when the treatment station is not occupied by a workpiece holder 6.

Figure 6:
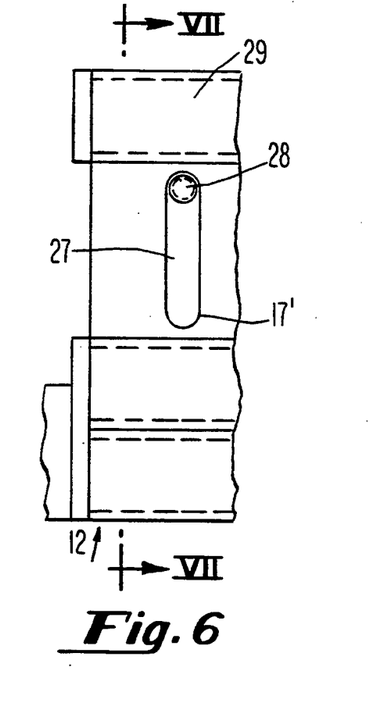
FIG. 6: a side view of an implementation of the masking device according to the invention
Figure 6A:
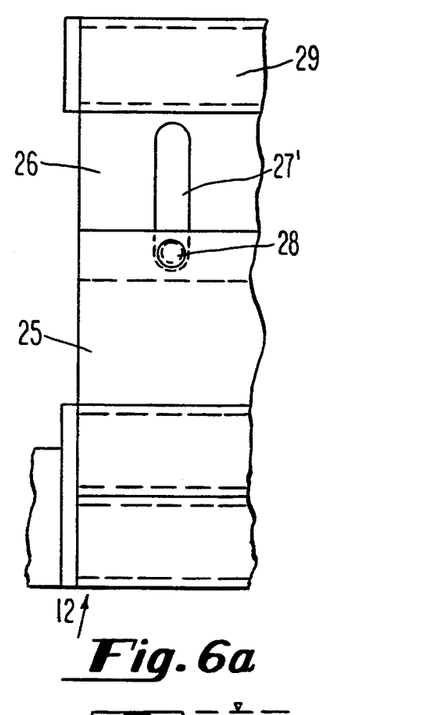
FIG. 6a: the masking device according to FIG. 6 in raised position
Figure 7:
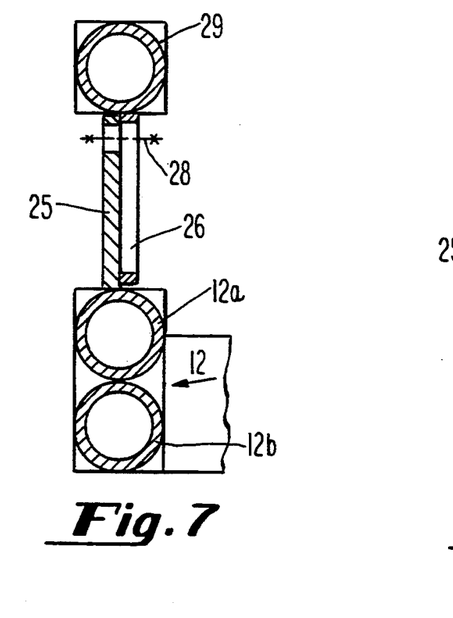
FIG. 7: a section along line VII—VII of FIG. 6
Figure 8:
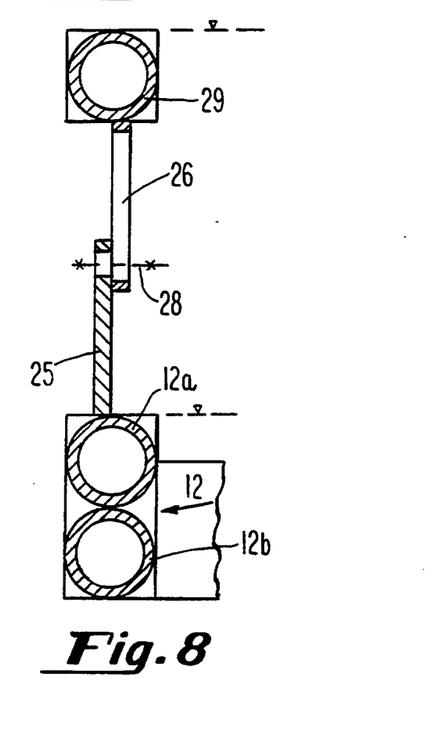
FIG. 8: a section analogous to FIG. 7, but with the masking device in another position

The construction of the float, comprising two pipes positioned one above the other, produces the advantage of a relatively large float volume with a relatively small width. Additional covers 25, which extend vertically upward from their point of attachment, can be provided on the respective upper pair of floats. When these pairs of floats are in a relatively deep position below the surface of the bath (such as that illustrated in broken lines in FIG. 1), these covers serve to shield the parts of the carrying rack 7 which are provided thereabove, and yet are still located within the bath against the undesired deposition of metallization. This shielding action can be enlarged spatially in the vertical direction by a further embodiment of the invention which is illustrated in FIGS. 6–8. Again, in this embodiment, the floats 12 consist of the two pipes 12a, 12b. Located atop the upper pipe 12a is a cover 25. A further cover 26 is vertically slidably connected thereto, specifically by means of vertically running slots 27 in the one cover 26 and bolts or the like 28, on the other cover 25, engaging in said slots 27. Attached to the upper cover 26 is a further closed float 29, which is located above the surface of the bath as long as the bottom float 12 is floating on the surface of the bath, or is pressed only slightly into the bath by the hold-down clamp 21. Only when the hold-down clamp 21 is adjusted to a deeper position does float 29 float on the surface of the bath, thereby pulling the masking bodies apart, i.e., out of the lowered position illustrated in FIG. 6 and into the raised position of FIG. 6a, thus practically doubling the height of the cover. This substantially increases the vertical play for the provision of a cover on the carrying rack.

Thus, the invention permits any desired adaptation of the shielding both in the case of upper areas of the workpieces and in the case of lower areas of the workpieces, and both when the workpieces are mounted on carrying racks and when they are mounted directly on the workpiece holders by means of clamps. The latter possibility has not been illustrated in the drawings as part of the exemplary embodiment shown, but in this case the levels of the floats or masks can be displaced in a similar manner to that of the previously explained exemplary embodiment.

We claim:

1. An apparatus for the masking of field lines in an electroplating plant for the treatment of essentially planar workpieces, which are loaded into a bath suspended from a workpiece holder, wherein masks are provided which are vertically adjustably guided on a plating tank, wherein a hold-down clamp is so attached to the workpiece holder as to be height-adjustable and fixable at a particular position, and moves the masks disposed laterally to the to-be-electroplated workpiece into a preselected position without applying force to the workpiece as the workpiece holder is loaded into a treatment station.

2. An apparatus according to claim 1, wherein the masks comprise floats which are pressed by the hold-down clamp against their buoyancy into the treatment fluid.

3. An apparatus according to claim 2, wherein mutually opposing masks, which are located on opposite side of the workpiece and spaced therefrom, are connected to each other by at least one strut, and an abutment of the hold-down clamp is positioned to lie upon the at least one strut.

4. An apparatus according to one of claims 1 to 3, wherein at least one vertically upwardly extending cover is located above the masks and serves to mask the region of a carrying rack.

5. An apparatus according to claim 4, wherein the at least one cover is slidably connected to a further cover that is substantially vertically disposed and connected to a float.

6. An apparatus according to claim 5, wherein the further cover possesses vertically disposed slots and the at least one cover possesses stops engaging in the slots and sliding therein.

7. An apparatus according to claim 1, wherein the bath comprises a treatment fluid having a given weight per unit volume and the masks comprise bodies whose weight is greater than the weight of the treatment fluid displaced by them.

8. An apparatus according to claim 7, wherein the masks are moved into a desired vertical position by the hold-down clamp by a band which is guided by guiding means.

9. An apparatus according to one of claims 1, 2, 3, 7, 8, wherein two pairs of masks are provided, wherein one pair is adapted for the masking of an uppermost horizontal workpiece edge, and the other pair adapted for the masking of lowermost horizontal workpiece edge, and one of the pairs is positioned vertically by means of the hold-down clamp, while the other pair is stationary with respect to the plating tank, wherein the level the stationary position can be altered by adjusting means.

10. An apparatus according to claim 9, wherein at least the masks whose level is to be positioned by the hold-down clamp consist of two tubular floats lying one above the other and closed at their ends.

11. An apparatus according to claim 9, wherein at least one vertically upwardly extending cover is located above the masks and serves to mask the region of a carrying rack.

12. An apparatus according to claim 11, wherein the at least one cover is slidably connected to a further cover that is substantially vertically disposed and connected to a float.

13. An apparatus according to claim 12, wherein the further cover possesses vertically disposed slots and the at lest one cover possesses stops engaging in slots and sliding therein.

14. An apparatus according to one of claims 1, 2, 3, 7, 8, wherein at least the masks whose level is to be positioned by the hold-down clamp consist of two tubular floats lying one above the other and closed at their ends.

15. An apparatus according to claim 14, wherein at least one vertically upwardly extending cover is located above the masks and serves to mask the region of a carrying rack.

16. An apparatus according to claim 15, wherein the at least one cover is slidably connected to a further cover that is substantially vertically disposed and connected to a float.

17. An apparatus according to claim 16, wherein the further cover possesses vertically disposed slots and the at least one cover possesses stops engaging in the slots and sliding therein.

* * * * *